(12) United States Patent
Williams et al.

(10) Patent No.: US 6,252,665 B1
(45) Date of Patent: Jun. 26, 2001

(54) LITHOGRAPHY USING QUANTUM ENTANGLED PARTICLES

(75) Inventors: Colin Williams; Jonathan Dowling, both of Pasadena, CA (US)

(73) Assignee: California Institute of Technology, Pasadena, CA (US)

(*) Notice: Subject to any disclaimer, the term of this patent is extended or adjusted under 35 U.S.C. 154(b) by 0 days.

(21) Appl. No.: 09/393,451

(22) Filed: Sep. 10, 1999

Related U.S. Application Data

(60) Provisional application No. 60/135,316, filed on May 20, 1999.

(51) Int. Cl.[7] .................................................. G01B 9/02
(52) U.S. Cl. ............................................................ 356/450
(58) Field of Search ..................................... 356/450, 451, 356/496

(56) References Cited

U.S. PATENT DOCUMENTS

| | | |
|---|---|---|
| 5,415,835 | 5/1995 | Brueck et al. . |
| 5,796,477 * | 8/1998 | Teich et al. ............................ 356/451 |
| 5,955,221 | 9/1999 | Sanders et al. . |
| 6,037,082 | 3/2000 | Capodieci . |
| 6,042,998 | 3/2000 | Brueck et al. . |
| 6,111,646 | 8/2000 | Naulleau et al. . |

* cited by examiner

Primary Examiner—Samuel A. Turner
(74) Attorney, Agent, or Firm—Fish & Richardson P.C.

(57) ABSTRACT

A system of etching using quantum entangled particles to get shorter interference fringes. An interferometer is used to obtain an interference fringe. N entangled photons are input to the interferometer. This reduces the distance between interference fringes by n, where again n is the number of entangled photons.

23 Claims, 3 Drawing Sheets

LITHOGRAPHY USING QUANTUM ENTANGLED PARTICLES

CROSS REFERENCE TO RELATED APPLICATIONS

This application claims the benefit of the U.S. Provisional Application No. 60/135,316, filed on May 20, 1999.

STATEMENT AS TO FEDERALLY SPONSORED RESEARCH

The invention described herein was made in the performance of work under a NASA contract, and is subject to the provisions of Public Law 96-517 (35 U.S.C. 202) in which the Contractor has elected to retain title.

FIELD OF INVENTION

The present application describes a technique of using quantum-entangled particles, e.g. photons, for lithography for etching features on a computer chip that are smaller than the wavelength of light used in the etching process, by some fraction related to the number of entangled particles.

BACKGROUND

Quantum mechanics tells us that certain unobserved physical systems can have odd behavior. A particle which is decoupled from its environment and which has two possible states will not necessarily be in either of those states, until observed. Putting this in quantum mechanical terms, the particle is simultaneously in a "superposition" of both of those states. However, this only applies while the particle is in certain conditions—decoupled from its environment. Any attempt to actually observe the particle couples the particle to its environment, and hence causes the particle to default into one or the other of the eigenstates of the observable operator.

This behavior is part of the superposition principle. The "superposition principle" is illustrated by a famous hypothetical experiment, called the cat paradox. a cat in a box with a vial of poison. The vial containing the poison could equally likely be opened or not opened. If the box/cat/poison is decoupled from its environment, then the cat achieves a state where it is simultaneously dead and not dead. However, any attempt to observe the cat, causes the system to default to dead or alive.

The theory of quantum mechanics predicts that N particles can also exist in such superposition states.

Lithography is a process of etching features on a substrate. Photolithography uses light to etch these features. Each spot can be etched, or not etched, to form a desired feature. In general, it is desirable to make the features as small as possible.

In the prior art, called Classical Optical Interferometric Lithography, a lithographic pattern is etched on a photosensitive material using a combination of phase shifters, substrate rotators, and a Mach-Zehnder or other optical interferometer. The minimum sized feature that can be produced in this fashion is on the order of one-quarter of the optical wavelength [Brueck 98]. The only way to improve on this resolution classically is to decrease the physical wavelength of the light used in the etching process.

This can come at a tremendous commercial expense. Optical sources and imaging elements are not readily available at very short wavelengths, such as hard UV or soft x ray.

SUMMARY

The present system uses a plurality of entangled particles, e.g., photons, in a lithographic system to change the lithographic effect of the photons.

The multiple entangled photons can etch features whose size is similar to that which could only be achieved by using light having a wavelength that is a small fraction of the actual light wavelength that is used.

In one disclosed embodiment, two entangled photons can be used a form an interference pattern that is double the frequency, or half the size, of the actual optical frequency that is used. This operation goes against the established teaching and understanding in the art that the wavelength of the illuminating light forms a limit on the size of features that can be etched. Usually, these features could not be made smaller than one-quarter or one-half of the wavelength of the light used to carry out the etching.

The present system enables forming features that are smaller than one-quarter of the wavelength of the light that is used, by some multiple related to the number of entangled particles that are used.

The present system for quantum lithography uses an interferometer that forms an interference pattern whose fringe spacing depends on both the number of entangled photons entering the device as well as their wavelength. Multiple entangled photons are used within the interferometer. These n entangled photons experience a phase shift that is greater, by a factor of n, than the normal phase shift that would be experienced by a single photon of the same wavelength in the same device. The changed phase shift forms a changed interference pattern in the output to achieve a changed frequency of interference fringes. By so doing, finer features can be etched.

An n-fold improvement in linear resolution is obtained by using n entangled particles, e.g. photons. A two dimensional lithographic operation effectively squares the improvement to density ($n^2$). As such, the entangled quantum lithography system makes it possible to etch features, for example, that are 1 to 10 nanometers apart, using radiation that has a wavelength $\lambda$, of 100 nanometers or more.

Another important use of this system is to retrofit an existing system. Interferometric lithography systems are already known and used. This system makes it possible to re-use those existing lithographic systems to obtain Better etching results. The established techniques of improving lithographic technology is by requiring owners to buy or build totally new semiconductor fabrication equipment that use shorter wavelength light. This system improves the resolved output of the same equipment. This allows existing interferometric lithography equipment to be effectively retrofitted.

Also, previous attempts to reduce feature size have used shorter wavelength light to reduce the feature size. That shorter wavelength light is always more energetic. Hence it can cause damage to the substrate.

In contrast, the present system reduces the etched feature size without requiring more energetic particles.

BRIEF DESCRIPTION OF THE DRAWINGS

These and other aspects will now be described in detail with reference to the accompanying drawings wherein.

DESCRIPTION OF THE PREFERRED EMBODIMENTS

Figure 1:
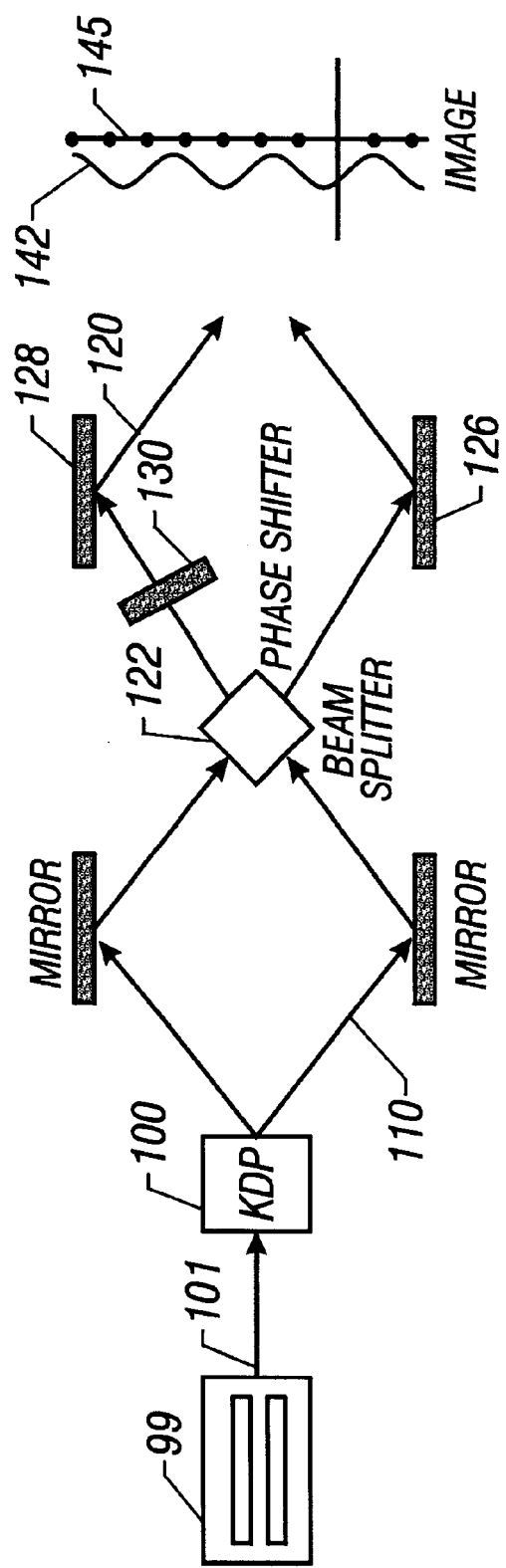
FIG. 1 shows a basic block diagram of the present system.

The present system replaces the classic "analog" optics of a lithographic system that has new "digital" optics that use a number of quantum-entangled particles, e.g. photons, electrons, atoms or the like. This will obtain the increased resolution, and reduction of feature size without shortening the physical wavelength. This system uses quantum entanglement effects to produce the same result as that previously obtained by using a shorter wavelength.

For example, if the uncorrrelated classical stream of photons is replaced by sets of n entangled photons, then the interference pattern has the form (1+(2nφ)) with φ =kx being the phase shift in one arm of the interferometer, and k =2π/λ being the wave number. Consequently, the peak to peak distance in the interference pattern now becomes λ/(2n). This is substantially smaller than the original peak to peak spacing of λ/2 and, in fact, increases the linear solution by a factor of n. So even though the optical source and imaging is done with a relatively long wavelength (λ), the effective wavelength of the interference pattern is λ/n. Therefore, the resolution increases by a factor of n.

Analog classical optics operates according to the so-called Rayleigh diffraction limit which imposes a restriction on minimum feature size that can be etched by a photon or other particle. This minimum feature size cannot be smaller than half a wavelength. The minimum size lines are on the order of λ/2, where λ is the optical wavelength used for the exposure. This limit on line sizes generally holds whenever classical optics and lenses are used for interferometric lithographic etching.

Put mathematically, the prior art classical device lays down a series of interferometrically-produced lines which obey the function form 1+cos(2φ) where k =2π/λ is the wave number, and λ is the optical wavelength, where I is the optical intensity and k=2π/λ is the wave number, and λ is the optical wavelength.

Quantum entangled photons are used in this application for reducing the size of the features. In a classical stream of photons used for interferometric lithography, the minimum size feature is on the order of one-half the optical wavelength. For a stream of n entangled photons, the interference pattern has the form (1+cos(2nφ)) with φ kx =2π/λ, resulting in an effective resolution of the interference pattern that scales linearly with n. The size of the feature is a function of the number of entangled photons n. Thus, for a given wavelength of photon, the resolution for entangled photons increases by n over the non-entangled classical system along one dimension. Etching in two dimensions can increase the resolution by $n^2$.

A single photon can be downconverted into two photons of lower wavelength. The polarization, energy and position of the resulting two photons are correlated because of conservation principles. In this particular case, the position correlation provides scaling properties. The ability to produce these entangled photons is well understood.

The present system uses particle beams which are quantum in nature to carry out this operation. These beams are composed of streams of single photons, each of which is an individual quantum particle that is decoupled from the system around it. The correlated particles are made to behave in a way that is non-locally correlated. In accordance with quantum mechanical theory, the position, direction of motion, and frequency of each photon depends on the other photon(s).

In the quantum optics community, it has been known for many years that light can exist in an entirely nonclassical state called a number state or a Fock state. This is described by Scully. The number state has no classical analog, as the coherent state does. In particular, the number state |N> has a precise and fixed number of photons in it. This is in contrast to the classical-like coherent state, which can only be determined to have a mean number of photons $n_{mean}=|\alpha|^2$ due to the quantum fluctuation factor Δn. The number state |N> has no intensity fluctuations, ΔN=0. This is a remarkable fact that gives the number state a digital quality; one can have either 0, 1, 2, etc., photons in a single number-state mode. Particles in number states can be produced en masse by a process called parametric downconversion. Number states have, however, somewhat paradoxical and non-intuitive properties.

FIG. 1 shows a block diagram of the overall quantum lithographic etching system. A single photon 101 of specified frequency is output from laser 99. This photon is sent to a downconverter 100.

A downconverter of this type receives a high-frequency photon into a nonlinear optical crystal of a material as KTP. A nonlinear interaction in the crystal generates a pair of daughter photons. If the original photon has frequency ω and vector wave number k, then the daughter photons have the very same quantities, $\omega_1$, $\omega_2$, $k_1$, $k_2$. The particles obey the laws of conservation of energy and momentum in the form, $$\omega=\omega_1+\omega_2, \quad (1a)$$

$$k=k_1+k_2, \quad (1b)$$

which entangles or correlates the photons in terms of energy and wave number. This correlation is the basis for many interesting experiments where the two daughter photons can be treated as number states in particular photon modes in an interferometer.

Figure 2:
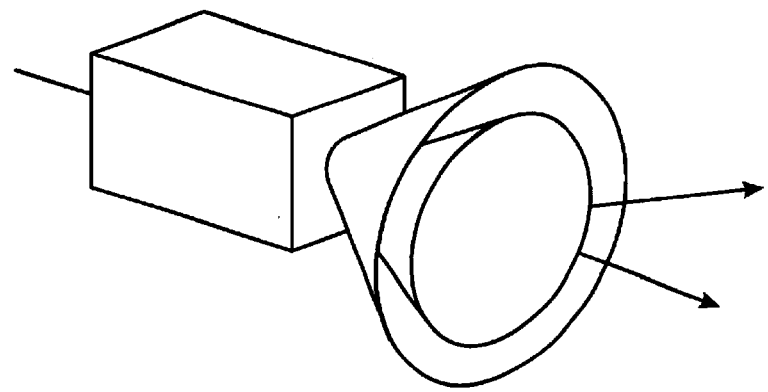
FIG. 2 shows a photon down converter.

The schematic for the down-conversion process is shown in FIG. 2. Incoming high frequency photons from the left are down-converted in a nonlinear crystal and produce two daughter photons that are correlated in both momentum and frequency. The vector wave number conservation condition, Eq. (1b), is logout degenerate in azimuthal angle about the initial photon propagation axis, generating a typically circular pattern of photons.

Figure 3:
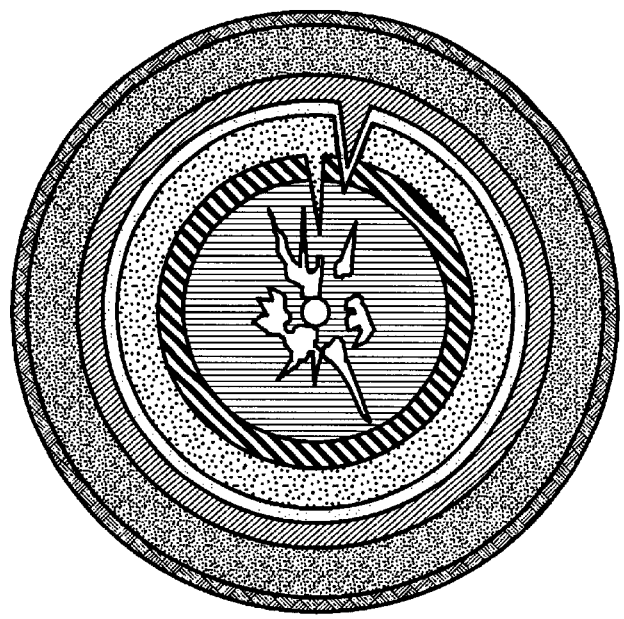
FIG. 3 shows a diagram of the result with corrected photons.

A typical spectral pattern is shown in FIG. 3. Choosing two points equidistant apart, as illustrated by the crosses in the FIG. 3, identifies by angular separation a particular down converted pair.

"Parametric" down conversion imposes the additional restriction that $\omega_1=\omega_2$ and $k_1=k_2$, which selects photon pairs symmetrically placed about the center of the spectrum in FIG. 2. By choosing appropriate angular deflections in the optics, these particular pairs can be captured.

The correlated photon particles are coupled through a coupler system 110 to beam splitter 122. This 122 is the input beam splitter to a partial Mach Zehnder interferometer with beam splitter 122, mirrors 126 and 128 and a phase shifter 130. The Interferometer produces parallel lines as its output. It has been demonstrated in Brueck, 98, "Interferometric lithograph—from Periodic Arrays to Arbitrary Patterns", Microelectron Eng 42: 145–148 March 1998, that etching a series of parallel lines can be generalized in the lithographic domain into forming any desired feature.

The correlations between the photons are quantum in nature, and the angular relation allows selection of a particular photon moving in a particular path, generating desired nonclassical number states of the form |N>.

Figure 4:
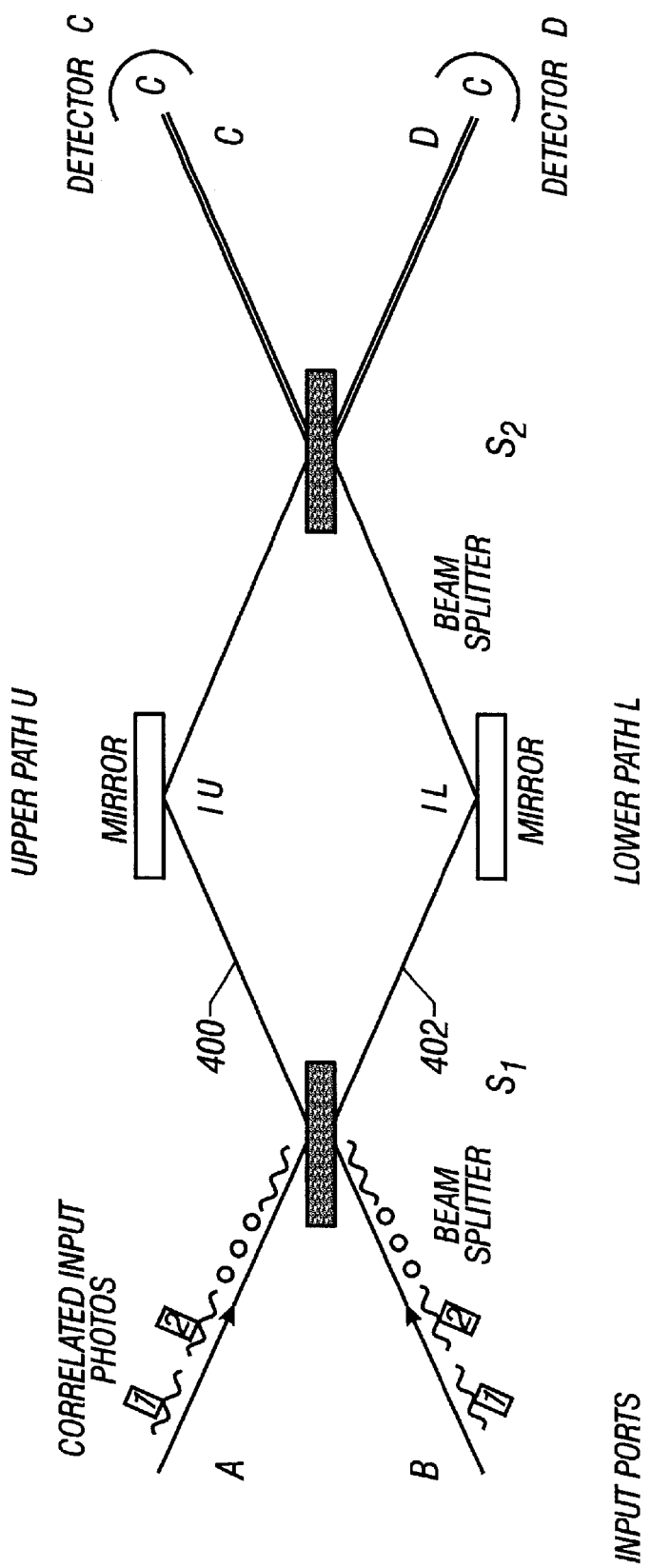
FIG. 4 shows a Mach-Zehnder interferometer.

A more detailed schematic of the Mach-Zehnder interferometer (MZI) is shown in FIG. 4. First and second correlated input photons 1 and 2 are input to both ports A and B.

Neglecting losses in the interferometer for this discussion, if the input optical intensity is some constant $I_0$, then for a classical interferometer-if all the input power enters from input port A-the superposition of C and D on the substrate will yield an interference pattern in lithographic resist at grazing incidence given by, $$I = I_0(1 + \cos 2kx)$$

where, $k = 2\pi/\lambda$ is the optical wave number, and x is the path difference between the first path 400 and the second path 402.

This result turns out have the same functional form whether or not one uses classical input light, quantum coherent (ordinary laser) input light, or number-state input light, provided one only uses the one upper input port A.

However, if both input ports A and B are used, then the results are different. In the case of dual-input-port entangled number states, $(|N\rangle|0\rangle + |0\rangle|N\rangle)/\sqrt{2}$, such as those produced in parametric photon down conversion, then the functional form of the two-photon absorption intensity changes to, $$I = I_0(1 + \cos 2Nkx) \qquad (3)$$

where the correlated photons enter the two ports entangled N at a time. Note that the N-photon interference pattern in that case oscillates N times as fast as before. Since the fringe intensity is proportional to the exposure rate, the minimal etchable feature size $\Delta x$ determined by the Rayleigh Criterion is given by the intensity minimum-to-maximum condition $Nk\Delta x = \pi$, or equivalently $\Delta x = \lambda/(2N)$, as noted above. This is a factor of N below the usual limit of $\Delta x = \lambda/2$.

In particular, using correlated photon pairs (i.e., N=2) it is possible to etch features on the order of size $\Delta x = \lambda/4$. With correlated photon triplets (i.e., N =3) it is possible to obtain features on the order of $\Delta x = \lambda/6$, and so on. Hence, using light of wavelength $\lambda = 200$ nm, features of size $\Delta x = 50$ nm can be etched using a stream of photons correlated two at a time (i.e., a stream of photons such that N=2).

The physics can be understood with reference to the case of N=2, for example. If the photons were not entangled or correlated, then at the first beam splitter in FIG. 4 would have a 50—50 chance of each photon taking the upper or lower path, independent of each other. The two photons behave independently, and in this case the result of Eq. (2) is obtained.

However, if the two input photons are entangled in number and position, which can be obtained from the down-conversion process using the downconverter 100 of FIG. 2, then the entangled photon pair move as a single unit. At the first beam splitter, both photons either take the upper path together, or they both take the lower path together. Quantum mechanically, this is written as, $$|\Psi\rangle = \frac{|2\rangle_L |0\rangle_U + |0\rangle_L |2\rangle_U}{\sqrt{2}}$$

where a 2 represents a bi-photon in the upper or lower branch mode, and the first state vector corresponds to one of the correlated photons, and the second to the other. We say that the bi-photon state is entangled in number and position. There are only two possibilities: they both take the high road (the pathe via mirror 128 in FIG. 1), or they both take the low road (the pathe via mirror 126 in FIG,. 1). Since it is impossible to distinguish, even in principle, which of these possibilities occurred-quantum mechanics demands that the probability amplitudes associated with these two paths be added to create an interference pattern.

Taking the phase differential $\Delta\phi = kx$ to be associated with an extra distance x in the upper path only, for convenience.

Then after propagating across the MZI, the state now has the form, $$|\Psi\rangle = \frac{|2\rangle_L |0\rangle_U + |0\rangle_L e^{2ikx}|2\rangle_U}{\sqrt{2}}$$

$$= \frac{|2\rangle_L |0\rangle_U + e^{2ikx}|0\rangle_L |2\rangle_U}{\sqrt{2}}$$

where each photon in the correlated pair contributes one factor of kx for a total of 2kx phase shift. When the state is interfered and recombined by focusing the photons on the substrate, the interference pattern has the form of Eq. (3) with N=2. This gives physical insight into how this sub-wavelength diffraction comes about.

The physical mechanism for the sub-wavelength interference effect arises then from the quantum digital nature of entangled photons. The number entanglement of the down-converted photon pair causes the photons to "talk" to each other in a nonlocal way. There is nothing at all like this in classical theory, where there are no photons-only "analog" electromagnetic waves. In a sense, the correlated photon pair behaves like a single entity, which is why it is referred to as a bi-photon.

This digital quantum mechanical object accumulates phase in the interferometer in a very nonstandard fashion. In particular, since both photons in the di-photon pair take the same interferometer path together, this object accumulates phase twice as fast as a single photon or a pair of un-entangled photons would. Since the phase shift is proportional to the path difference divided by the wavelength, and the wavelength is fixed, this means that the same path differential $\Delta x$ provides double the phase shift. This gives rise to two-photon interference fringes that have half the spacing as before.

Interferometers have been used in lithography to produce an interference pattern based on a phase shift that causes an interference pattern. FIG. 1 shows a two-input port interferometer 120 whose output gives the desired photon interference pattern. This is used to write an arbitrary pattern 142 on a photographically sensitive material resist 145. This is similar to the standard set up for state of the art classical optical interferometric lithography schemes. The present invention replaces the classical electromagnetic fields with the appropriate quantum photon creation and annihilation operators corresponding to the various ports.

According to the present system, the classical optical beam is replaced by a quantum stream of n entangled photons. We have shown that this makes it possible to generate a simple linear matrix relationship between the photon operators at the input ports and those at the output ports [Dowling 98]. The details of the transfer matrix depends on the optical elements that make up the interferometer. More phase shifters, beam splitters, mirrors, etc., make a more complex matrix. Nevertheless, it is still linear and it is a straightforward problem to translate any arbitrary two-port interferometric system into an appropriate two-by-two transfer matrix. This matrix, can also include complex terms that account for noise sources in the interferometer. These noise sources could otherwise lead to photon loss or the loss of the quantum correlations.

One can think of the entire interferometer as a simple quantum circuit with two inputs and two outputs. This allows the interferometer to be handled in the recently well-developed formalism of quantum circuit theory. Additional photon circuits can be added in parallel to the lithographic circuit in order to apply fault-tolerant quantum error correction techniques in order to minimize the effect of noise sources, allowing maximum resolution and contrast in the lithographic exposure.

Once the quantum operator transfer matrix is in place, a complete description of how an arbitrary photon state propagates through the interferometer and images interferometric lines at the output ports exists. Now an additional degree of freedom is obtained by the wide range of photon input states. For example, choosing a coherent state in only one input port gives the standard classical results, which can then be used as a control. Then combinations of number states for the quantum input state can be used to image the sub-wavelength image at the output. The number of states can be chosen to be entangled or correlated in a large number of different ways in the simulation. Some of these choices are the natural output of a nonlinear photon down converter or a parametric oscillator, and others can be generated in preprocessing step with linear optical elements.

For example, it is well known that a simple optical beam splitter can take an unentangled number direct-product state and convert it into a nonseparable entangled number-state output, of the form of Eq. (4), needed for this device.

According to a first disclosed mode, correlated photon pairs (N=2) are used. This makes it possible to etch features on the order of size $x=\lambda/4$. For example, light of wavelength 200 nanometers could be used to etch features of size x=50 nanometers using a stream of two entangled photons correlated photons. These photons are relatively easy to produce using the optical process of photon down conversion. Moreover, these photons produce the surface damage of a 200 nm photon, even though they have the resolution of a 100 nm photon.

Another mode uses correlated photon triplets (N=3). This etches features on the order of $x=\lambda/6$ in three-photon absorption.

In fact, there is no theoretical limit on the number of correlated photons that could be produced, and hence no limit the amount of division below the Rayleigh-limited value.

Another important advantage is beating the damage criterion that is caused by etching in classical physics. Each photon carries an energy $e=\lambda$ which $=hc/\lambda$ per photon. Hence the energy of the photons rise inversely with decreasing wavelengths.

This can cause undesired resist damage to the material being etched. In addition, statistical fluctuations, called shot noise, can cause clumping of the arriving high frequency photons and hence lead to irregularities in the etch. This system allows etching features that have a better resolution without correspondingly increasing the damage potential.

Specifically classical systems have a linear ratio of energy (damage potential) to feature size. The present system improves this ratio by a factor of the number of entangled particles.

The laser used herein is a titanium sapphire laser, producing an output wave on the order of 100 to 200 nanometers. The optically nonlinear crystal is a KDP crystal doped with $LiIO_3$.

Any kind of interferometer could be used. While the present specification describes a Mach Zehnder Interferometer, any other kind can be used with these teachings.

Although only a few embodiments have been disclosed in detail above, those with ordinary skill in the art certainly understand that modifications are possible in the preferred embodiment and that such modifications are intended to be encompassed within the following claims, in which:

What is claimed:

1. A quantum method, comprising:
   obtaining multiple entangled photons; and
   using said photons in an interferometer that forms an interference fringe;
   said interference fringe being greater, by a factor of n, than the phase shift that would be experienced by a single photon of the same wavelength.

2. A method as in claim 1, where said obtaining comprises using a non linear crystal to obtain said multiple entangled photons, and applying said photons to the interferometer.

3. A method as in claim 1, wherein said obtaining uses parametric downconversion.

4. A method as in claim 1, wherein said interferometer is a Mach Zehnder interferometer.

5. A method as in claim 1, wherein said interferometer has two input ports.

6. A method as in claim 5, wherein said using comprises applying first and second correlated input photons to both of said two input ports of said interferometer.

7. A method as in claim 5, wherein said using comprises applying first, second and third correlated input photons to both of said two input ports of said interferometer.

8. A method as in claim 1, further comprising adding an additional photon circuit in parallel to said interferometer, for fault-tolerant quantum error correction to minimize the effect of noise sources.

9. A method of retrofitting a lithographic system, comprising:
   obtaining an interferometric lithography system that uses an interferometer to produce interference fringes; and
   using quantum entangled particles as input to said interferometric lithography system to improve the resolved output of the same equipment.

10. A method as in claim 9, wherein said using comprises using a photon creating circuit to create entangled photons.

11. A method as in claim 10, further comprising adding an additional photon circuit in parallel to said interferometer, for fault-tolerant quantum error correction to minimize the effect of noise.

12. A system of forming an optical output, comprising:
   a photon system, producing a plurality n of entangled photons, where n is greater than one; and
   an optical system, including an interferometric device that produces interference between said n entangled photons, and producing an output intensity of a form $I(x)=(1+\cos nkx)/2$, where $k=2\pi/\lambda$ and $\lambda$ is a wavelength of the photons.

13. A system as in claim 12, further comprising an additional photon circuit, in parallel to said interferometric device, carrying out fault-tolerant quantum error correction to minimize the effect of noise.

14. A system as in claim 12, wherein said interferometric device is a Mach Zehnder interferometer.

15. A system as in claim 12, wherein said photon system includes a parametric downconverter, producing n=2 entangled photons.

16. A method of carrying out quantum lithography, comprising:
   obtaining a plurality of entangled particles, which are quantum entangled with one another;
   establishing an interferometer system which is decoupled to its environment, and applying said entangled particles into said interferometer system to cause interference there, between to form interference fringes spaced from one another by $\lambda$ over 4N where N is a number of decoupled photons.

17. A method as in claim 16, further comprising compensating for noise in said interferometer system.

18. A quantum mechanically entangled optical system, comprising:

a source of quantum mechanically-entangled particles with a wavelength $\lambda$; and an interferometer which produces an interference pattern by producing a phase shift between n of said entangled particles, where n>1, and using said phase shift to produce an interference fringe, where said interference fringe has bright spots and dark spots, an adjacent bright spot being spaced from one another by less than $\lambda/4$.

19. A system as in claim 18 further comprising a second particle system, used to compensate for noise.

20. A method of forming interference fringes, comprising:

producing a plurality n of entangled particles with a wavelength $\lambda$;

inputting said entangled particles into an interferometric device which produces a phase shift between different paths;

obtaining an output of said interferometric device having a pattern spacing between parts of said pattern proportional to $\lambda$ over 4N where N is the number of entangled particles; and producing additional particles for use in noise reduction.

21. A method as in claim 20, wherein said output oscillates N times as fast as it would have oscillated with a single particle.

22. A method as in claim 20, wherein said particles are photons.

23. A method of lithography as in claim 13, involving the use of photons of light of wavelength $\lambda$, entangled N at a time, which can be used to fabricate periodic gratings and periodic memory elements whose components are spaced at a frequency N times greater than is possible using conventional interferometric lithography at wavelength $\lambda$.

* * * * *